United States Patent
Kelly et al.

(10) Patent No.: US 6,756,307 B1
(45) Date of Patent: Jun. 29, 2004

(54) APPARATUS FOR ELECTRICALLY PLANARIZING SEMICONDUCTOR WAFERS

(75) Inventors: John Kelly, Palo Alto, CA (US); Wilbert G. H. van den Hoek, Saratoga, CA (US); John S. Drewery, Alameda, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/209,171

(22) Filed: Jul. 29, 2002

Related U.S. Application Data (63) Continuation-in-part of application No. 09/967,075, filed on Sep. 28, 2001, now Pat. No. 6,709,565, which is a continuation-in-part of application No. 09/758,307, filed on Jan. 9, 2001, now Pat. No. 6,653,226, which is a continuation-in-part of application No. 09/412,837, filed on Oct. 5, 1999, now Pat. No. 6,315,883.

(51) Int. Cl.$^7$ ............................................. H01L 21/302
(52) U.S. Cl. ..................... 438/691; 438/626; 438/692; 438/645; 438/631; 205/640; 205/645; 205/652; 205/654
(58) Field of Search ...................... 438/626, 631, 438/633, 645, 690, 691, 692, 693; 205/640, 641, 644, 645, 649, 652, 653, 654

(56) References Cited

U.S. PATENT DOCUMENTS

| | | | | |
|---|---|---|---|---|
| 6,143,155 A | * | 11/2000 | Adams et al. | 205/123 |
| 6,176,992 B1 | * | 1/2001 | Talieh | 205/87 |
| 6,251,235 B1 | * | 6/2001 | Talieh et al. | 204/220 |
| 6,315,883 B1 | * | 11/2001 | Mayer et al. | 205/123 |
| 6,447,668 B1 | * | 9/2002 | Wang | 205/645 |
| 6,653,226 B1 | * | 11/2003 | Reid | 438/631 |

* cited by examiner

*Primary Examiner*—Kevin M. Picardat
(74) *Attorney, Agent, or Firm*—Beyer Weaver & Thomas, LLP (57) ABSTRACT

The present invention pertains to apparatus and methods for electroplanarization of metal surfaces having both recessed and raised features, over a large range of feature sizes. The invention accomplishes this by use of a flexible planar cathode and a spacing pad thereon. Methods of the invention are electropolishing methods. During electroplanarization, the flexible planar cathode conforms to the global contour of the work piece (e.g. a wafer) while the spacing pad conforms to local topography of the metal layer being planarized. In this way, dishing is reduced in the final planarized metal layer.

64 Claims, 7 Drawing Sheets

APPARATUS FOR ELECTRICALLY PLANARIZING SEMICONDUCTOR WAFERS

CROSS-REFERENCE TO RELATED APPLICATIONS

This application is a continuation-in-part claiming priority under 35 USC §120 from U.S. patent application Ser. No. 09/967,075 filed Sep. 28, 2001 now U.S. Pat. No. 6,709,565 naming Mayer et al. as inventors, and titled "Method and Apparatus for Uniform Electropolishing of Damascene IC Structures by Selective Agitation," which in turn is a continuation-part. claiming priority under 35 USC §120 from U.S. patent application Ser. No. 09/412,837 filed Oct. 5, 1999, naming Mayer et al. as inventors, and titled "Electroplanarization of Large and Small Damascene Features Using Diffusion Barriers and Electropolishing," which has issued as U.S. Pat. No. 6,315,883 on Nov. 13, 2001. This application is also a continuation-in-pat of U.S. patent application Ser. No. 09/758,307 filed Jan. 9, 2001, now U.S. Pat. No. 6,653,726 and titled "Method for Electrochemical Planarization of Metal Surfaces", naming Reid as the inventor. Each of these applications are incorporated herein by reference in their entireties for all purposes.

FIELD OF THE INVENTION

The present invention pertains to apparatus and methods for surface planarization of metal surfaces. More specifically, it relates to electropolishing technology for planarizing metal surfaces.

BACKGROUND OF THE INVENTION

In the fabrication of integrated circuits, as the number of levels in an interconnect technology is increased, the stacking of additional layers on top of one another produces a more and more rugged topography. Compounding this problem, electroplating bath additives are now more commonly utilized to aid in the rapid "bottom-up" filling of higher aspect ratio features (e.g. in Damascene copper electroplating processes) to ensure homogeneous metal fill of narrow features. Baths with "bottom-up" filling characteristics fill smaller features much more rapidly than baths without such additives. In some cases (e.g. plating baths with superior bottom-up filling characteristic and no leveling additives) plating occurs at an accelerated rate after completing the small feature filling stage. When many high aspect ratio features are located in close proximity, a macroscopic raised area (series of bumps or a raised plateau) can be formed. This bump formation is also termed, "feature overplating."

Thus, use of advanced "bottom up" electrofill paradigms in combination with wafers having many low and high aspect features have created a problem of deposited metal surfaces having a range of topography to be planarized that is unusually large, i.e. containing both recessed and raised areas. Commonly, features that vary in size by two orders of magnitude on a single layer exist. A 1 $\mu$m deep feature can have widths of from 0.2 $\mu$m to 100 $\mu$m. Therefore, while electroplating is a preferred method of metalization, various aspects of improved plating regimens create challenging topography for subsequent planarization. Without planarization, the microscopic canyons that result on the integrated circuit surface from stacking of device features create a topography that (1) would limit the resolution of photo-lithography and creation of dense feature patterns, and (2) would lead to defects in the integrated circuit that would make the circuit unusable.

One method of planarization used in the art is chemical mechanical polishing (CMP). CMP is a process that uses a mixture of abrasives and pads to polish the surface of the integrated circuit. Unfortunately, CMP polishing techniques are difficult to control; the endpoint can be difficult to detect. They are also expensive. The high equipment cost, waste handling cost, and low throughput contribute to the overall expense of CMP. Also, with the introduction of low-k dielectrics into chip production, modification of traditional CMP processes will be required, as current methods result in cracking and delamination of most low-k materials, which have a very low compression strength, and are extremely fragile.

Another method of planarization involves electrolytic etching technique such as electropolishing or electroless etching. These techniques are low cost methods, relative to CMP. Lower capital cost, easier waste handling, and much higher processing rates make them desirable alternatives to CMP. Electropolishing is a method of polishing metal surfaces by applying an electric current through an electrolytic bath, and removing metal via electrolytic dissolution. The process may be viewed as the reverse of electroplating.

A problem arises during the electropolishing of surfaces in which a large number of low aspect ratio (larger width than depth) features exist. Wide interconnect lines (trenches cut in a dielectric layer for a damascene process) and contact/bond pads often have low aspect ratios. Low aspect ratio features generally require the plating of an overburden layer slightly thicker than the thickness of the Damascene layer so that the feature will be completely filled after planarization. The metal fill profile above these features exhibits large recesses having profiles which resemble the original (low aspect ratio) feature. The metallization processes used to deposit the metal, which are substantially conformal over such low aspect ratio features, are typically not continued to a point which would geometrically "close" such recesses, because to do so would require depositing a very thick metal layer. To do so would be uneconomical due to necessary removal of the large excess of metal at a later stage. Conventional electropolishing techniques can planarize a surface in which the recessed feature to be planarized is no more than perhaps three times as wide as it is deep. For features wider than these, the rate of removal is essentially uniform everywhere. When the metal layer is electropolished to the dielectric surface, recesses over low aspect ratio features are propagated and expanded to produce recesses that span the width of these features leaving effectively little or no metal in the pad regions. Obviously, this is an unacceptable result.

Reid (U.S. patent application Ser. No. 09/758,307 filed Jan. 9, 2001) describes a method of electrochemical planarization of metal surfaces in which planarization rates are modulated by tight control of the distance between a metal layer to be planarized and a planar cathode (in conjunction with a highly resistive electrolyte). Mayer et al. (U.S. patent application Ser. No. 09/412,837, filed Oct. 5, 1999) describe a method of planarization of metal layers in which a "pad" is used to create localized fluid agitation (and/or physical contact) in raised regions relative to recessed regions to facilitate planarization. Although these inventions address the need for improved electroplanarization in semiconductor fabrication, with the demand for increasingly smaller device features, additional methods and apparatus for metal planarization would be desirable. In particular, it would be desirable to have methods and apparatus that more specifically address non-uniform electropolishing in localized areas of a wafer relative to global planarization.

What is needed therefore is improved electropolishing technology for planarizing conductive layers having varying topography, particularly metal layers having both recesses and raised regions having both very narrow (submicron) and very wide (on the order of 100 micron) widths.

SUMMARY OF THE INVENTION

The present invention pertains to apparatus and methods for electroplanarization of metal surfaces having both recessed and raised features, over a large range of feature sizes. The invention accomplishes this by use of a "reclaim cathode" together with a flexible planar cathode and a spacing pad thereon. During electroplanarization, the flexible planar cathode conforms to the global contour of the work piece (e.g. a wafer) while the spacingpad conforms to local topography of the metal layer being planarized. In this way, dishing is reduced in the final planarized metal layer. The reclaim cathode serves as a counter electrode to the metal workpiece (anode). Therefore, most of the cathodic Faradaic reaction takes place at the reclaim electrode. To a lesser degree, the flexible cathode may undergo some Faradaic reaction.

One aspect of the invention is an electroplanarizing apparatus for removing a portion of a metal layer disposed on a wafer work surface. Such apparatus may be characterized by the following features: a wafer holder for holding the wafer such that the metal layer is exposed, the wafer holder configured to supply an anodic electrical current to the metal layer; a flexible planar cathode having a spacing pad on its surface; a movement assembly configured to position the wafer work surface and the flexible planar cathode into close proximity with each other, whereby at least a pre-defined separation distance between the flexible planar cathode and wafer work surface can be maintained throughout an electroplanarization process; an electrolyte delivery mechanism configured to provide an electrolyte to the spacing pad while the wafer is in contact with the spacing pad; and a mechanism for applying a substantially uniform force per unit area to the back side of the flexible planar cathode, thereby compressing the spacing pad between the flexible planar cathode and the wafer work surface. Many embodiments also include a reclaim cathode physically separated from the flexible cathode and serving as a primary counter electrode to the wafer. Preferably during the electroplanarization process, electrical current passes between the metal layer and the reclaim cathode, primarily, and between the metal layer and the flexible planar cathode, secondarily. Ionic current will normally flow through at least that portion of the electrolyte contained in the spacing pad.

Preferably the movement assembly further includes a mechanism for creating a lateral relative movement between the wafer work surface and the spacing pad work surface. Also preferably, the lateral relative movement between the wafer work surface and the spacing pad work surface includes at least one of (a) rotating the wafer, the flexible planar cathode, or both about an axis substantially perpendicular to the wafer work surface, (b) moving the wafer, the flexible planar cathode, or both via linear movements along one or more axes substantially parallel to the wafer work surface, (c) orbiting the wafer, the flexible planar cathode, or both substantially parallel to the wafer work surface; and (d) combinations thereof.

Preferably the mechanism for applying a substantially uniform force per unit area to the back side of the flexible planar cathode applies a force of between about 0.2 and 2 psi, more preferably less than 1 psi. Preferably the mechanism for applying a substantially uniform force per unit area to the back side of the flexible planar cathode includes at least one of (a) a fluid pressure differential in the electrolyte due to restricted flow of the electrolyte from the back side of the flexible planar cathode through the porous matrix and the spacing pad, and (b) a compressive material contacting the back side of the flexible planar cathode.

Another aspect of the invention is a flexible planar cathode assembly for electroplanarizing a metal layer disposed on a wafer work surface. Such a cathode assembly may be characterized by the following features: (a) a flexible electrode (e.g., a flexible substrate coated with a conductive material), the flexible electrode having a substantially planar front side surface; and (b) a spacing pad affixed to the substantially planar front side surface of the flexible electrode. Preferably the flexible electrode is between about 15 and 300 $\mu$m thick. Also preferably the flexible electrode is made of at least one of silicon, polyimide, Kapton, polyurethane, polyethylene (Mylar), mica, and polycarbonate. Or the substrate can be omitted leaving just a thin metal electrode. Alternatively the flexible electrode could be a strong metal such as stainless steel, molybdenum, tungsten, tantalum, or a nickel-based alloy such as Hastelloy® C-22, Monel® or Inconel® which has been coated (e.g. by electroplating or sputtering or chemical vapor deposition) with an electrochemically suitable metal. In the embodiment where the flexible electrode comprises a flexible substrate with a conductive material thereon, the conductive material preferably includes at least one of platinum, copper, gold, palladium, ruthenium, various platinum-rhodium or platinum-iridium alloys. In general metal should be higher on the electrochemical series than copper (or should be copper). In some embodiments, the flexible planar cathode includes a porous matrix configured to allow electrolyte to flow through it.

Spacing pads of the invention will be chemically compatible with the electrolyte (i.e. will not dissolve or otherwise break down). The pad will have a small pore size and be sufficiently porous to allow fluid and electrical current to easily flow through. A long-lived pad is also desirable, i.e. one that wears slowly. The spacing pad is generally a non-abrasive pad. In certain specific embodiments, the spacing pad is made of at least one of a perfluoroalkoxy material, urethane material and polyvinyl alcohol (PVA). Preferably the spacing pad will include a plurality of pores having a mean diameter of between about 0.02 $\mu$m and 10 $\mu$m. Whatever the porous nature of the pad, preferably the spacing pad has a void volume of between about 20 and 80 percent. Generally the pad will be thin. Preferably the spacing pad, when uncompressed, is at least about three times as thick as the largest variation in height between a plurality of recessed regions and raised regions in the metal layer disposed on the wafer work surface. In a specific embodiment, the spacing pad is between about 3 and 20 microns thick.

Also preferably, the flexible electrode and the spacing pad are made of materials and configured such that, during an electroplanarization process in which a substantially uniform force per unit area is applied to the back side of the flexible electrode, the spacing pad conforms to local surface contours in the metal layer arising from a plurality of recessed and raised regions in the metal layer, while the flexible electrode conforms only to the global contour of the wafer.

Yet another aspect of the invention is a method of electroplanarizing a metal layer disposed on a wafer work surface, the metal layer having a plurality of recessed and raised regions. Such methods may be characterized by the following sequence: positioning the wafer work surface and a flexible planar cathode into close proximity with each other, the flexible planar cathode including a spacing pad on its work surface, the spacing pad and the metal layer contacting each other; applying a substantially uniform force per unit area to the back side of the flexible planar cathode, thereby compressing the spacing pad between the flexible planar cathode and the metal layer; passing an ionic electrical current from the metal layer, through an electrolyte solution contained at least in the spacing pad, and to the reclaim cathode, as well as the flexible planar cathode, such that the metal is electrolytically removed from the surface of the metal layer; and stopping the passage of current at a point where all or a majority of the metal layer is removed from the field of the wafer work surface. In some embodiements, such methods will further include substantially maintaining a pre-defined separation distance between the flexible planar cathode and the wafer work surface during electroplanarization. Also, such methods preferably further include creating a relative movement between the wafer work surface and the spacing pad before and during electroplanarization. Preferably the result of such methods is that dishing, across any region of the metal layer surface greater than 20 $\mu$m in diameter, is less than 100 nanometers deep, more preferably less than 50 nanometers deep. Also preferably such methods will further include recycling the electrolyte during electroplanarization.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described in terms of methods and apparatus in relation to electroplanarization of a metal layer for semiconductor wafer processing. The invention is not limited to semiconductor wafer processing, that is, the invention can be used to planarize metal surfaces on other work pieces as well. In some descriptions herein, well-known processes, procedures, and components have not been described in detail so as not to unnecessarily obscure aspects of the present invention.

This invention enables electroplanarization by electropolishing such that the topography created by metal filling both large (e.g., >5 $\mu$m wide, low aspect ratio) and small (e.g., <5 $\mu$m wide, high aspect ratio) features is effectively planarized. In the context of copper Damascene processing, a substantially flat substrate is produced in which embedded metal remains in a dielectric/insulating media.

Figure 1:
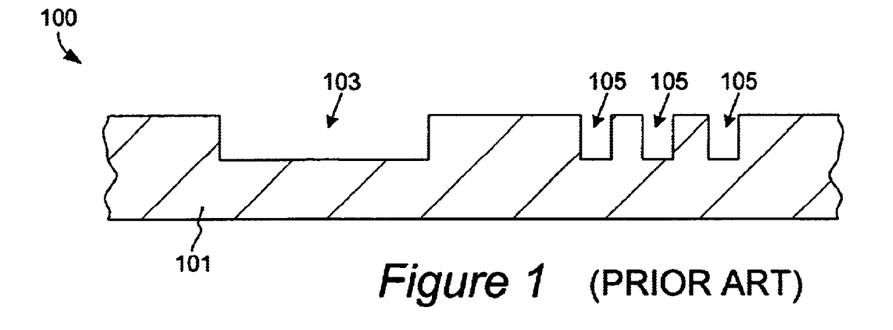
FIGS. 1–6 depict representative wafer substrates in accordance with aspects of the invention.

An initial operation in a Damascene process involves the manufacture of recessed trenches, via holes, pad structures, or the like into the dielectric substrate. FIG. 1 depicts a cross sectional portion 100, of a dielectric substrate 101 (for example an $SiO_2$ layer on a wafer), having low aspect ratio feature 103, and high aspect ratio features 105 etched in its surface.

Before a metal layer (intended to fill features 103 and 105) is deposited on patterned dielectric 101, typically a diffusion barrier (to prevent diffusion of metal ions into the dielectric), an adhesion barrier (to aid in adhesion of subsequently deposited metal), and a metal seed layer (to provide a conductive layer for electroplating processes) may be applied. For simplicity, these films are not depicted in these figures, but it understood in the art that deposition of these films are conventional aspects of Damascene processing.

Preferably, the metal layer will be comprised of copper or an alloy of copper. Note that metals are typically employed as interconnects and contact pads in integrated circuits. Copper is a particularly preferred metal for use in Damascene-type processes to form interconnects and contact pads. Other metals that may be suitable for use for this invention include aluminum, silver and gold. In some cases, the layer may be formed from a non-metal conductive material, so long as that conductive material is susceptible to planarization via electropolishing.

Figure 2:
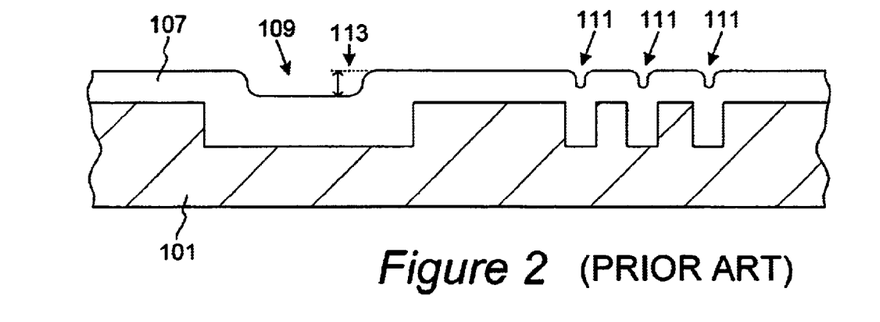

As depicted in FIG. 2, when the openings in dielectric 101 are filled with a metal 107 by a process such as electroplating, a minimum amount of metal must be added to the part in order to completely fill the feature. Electroplating generally yields conformal deposition that typically leaves large recessed areas 109 over low aspect ratio features, and small recessed areas ("nips") 111 over high aspect ratio features (when conventional baths are used). In this case, the range of topography to be planarized spans only the depth of the features 109 and 111. See dimension 113 depicted in FIG. 2.

More commonly however, electroplating bath additives (containing "superfilling" components) are utilized to aid in the rapid "bottom-up" filling of higher aspect ratio features to ensure homogeneous metal fill of these narrow features. In this case, plating occurs at an accelerated rate after completing the small feature filling stage. When many high aspect ratio features are located in close proximity (e.g. features 105 in FIG. 1), a macroscopic raised area (bump) can be formed.

Figure 3:
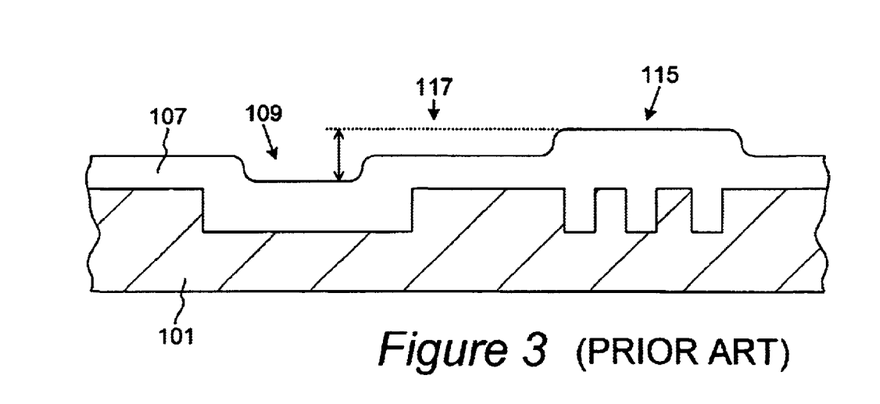

FIG. 3 depicts the result of such metal deposition on dielectric 101. While low aspect ratio features are filled as before, forming recessed area 109; over clusters of high aspect ratio features, overplating occurs, which forms a bump or plateau 115. The plateau is believed to form by combination of a series of smaller bumps, each forming over an individual feature, that later merge. In this case, the range of topography to be planarized spans not only the depth of recess 109, but also the height of bump 115. See 117.

Figure 4:
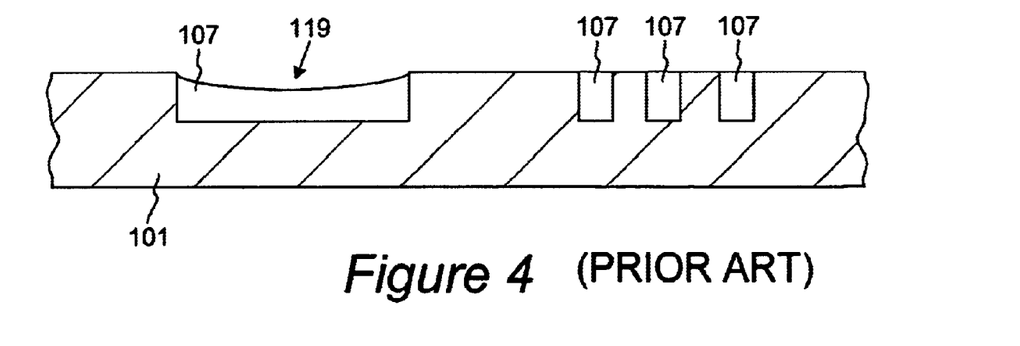

Conventional electropolishing techniques can planarize a surface in which the feature to be planarized is no more than perhaps three times as wide as it is deep. For features wider than these, the rate of removal is essentially uniform everywhere. FIG. 4 depicts a cross-sectional layer of dielectric 101 after conventional electropolishing. Although metal 107 is electropolished effectively to the dielectric surface level over the high aspect ratio features, recesses 109 are propagated and expanded to produce recesses 119. Recesses 119 span the width of low aspect ratio features leaving effectively no metal in the pad regions. Obviously, this is an unacceptable result.

Figure 5:
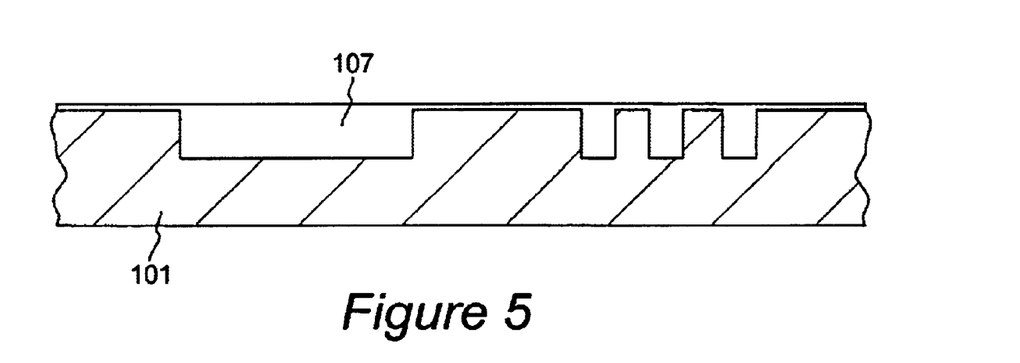
Figure 6:
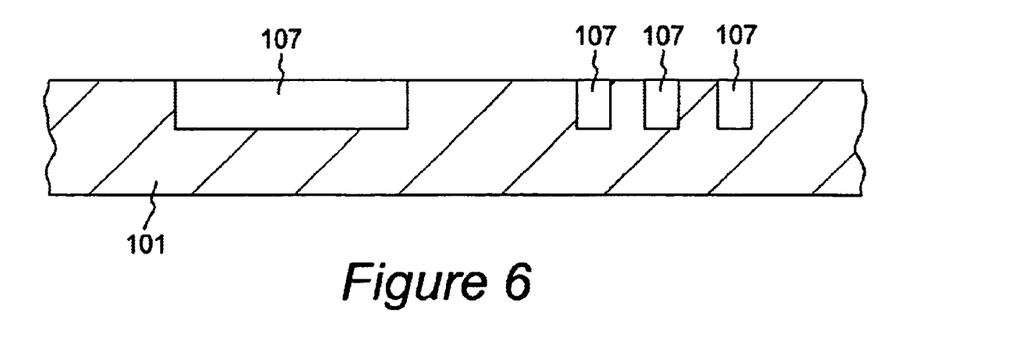

The invention is particularly useful for planarizing metal layers having a range of topography that is unusually large, i.e. containing both recessed and raised areas. Commonly, features that vary in size by two orders of magnitude on a single layer exist. A 1 $\mu$m deep feature can have widths of from 0.2 $\mu$m to 100 $\mu$m. FIGS. 5 and 6 depict the result of planarization of such metal layers with the invention. Either the metal is planarized until a planar continuous metal surface is achieved (see FIG. 5) or, as mentioned above, the metal is planarized until a substantially flat substrate is produced in which embedded metal remains in a dielectric/insulating media (see FIG. 6).

Figure 7:
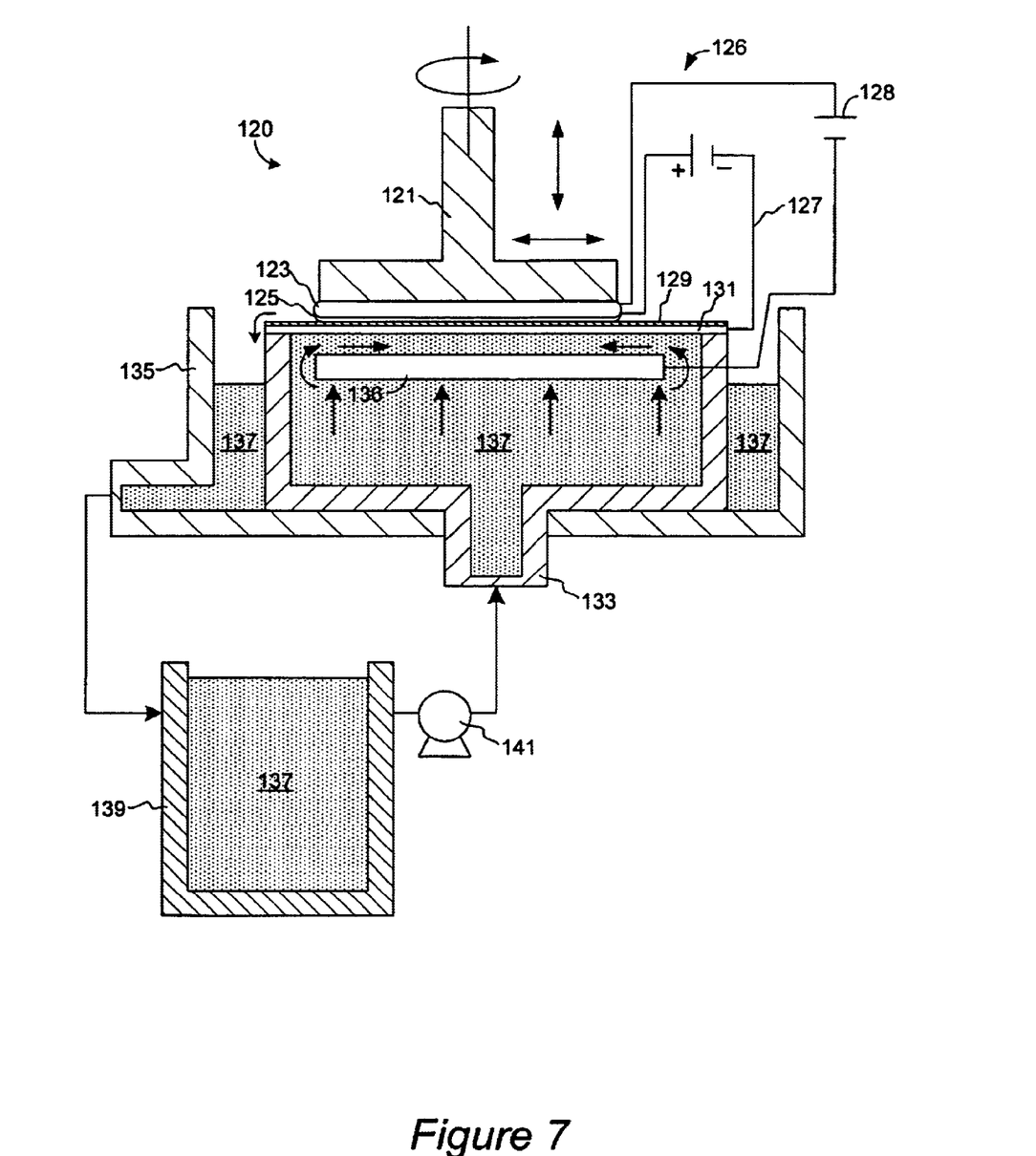
FIG. 7 is a cross-sectional depiction of an exemplary electroplanarization apparatus in accordance with the invention.

As mentioned, one aspect of the invention is an apparatus for electroplanarization of a metal layer on a wafer work surface. Details of an exemplary apparatus of the invention are described in conjunction with FIG. 7 (some reference numbers are also used in subsequent figures for simplicity and clarity). FIG. 7 depicts a simplified cross-sectional view of an electroplanarizing apparatus 120 of the invention. Electroplanarizing apparatus 120 has a wafer holder 121 which holds wafer 123. Note, that the concept of a "wafer holder" extends generally to various combinations and subcombinations of components that engage a wafer and allow its movement and positioning. Wafer 123 has a work surface having a metal layer, 125, thereon. Wafer holder 121 provides a number of positioning capabilities for wafer 123 including (a) rotation of wafer 123 about an axis perpendicular to its work surface (as depicted by the arrow around an axis depicted at the top of wafer holder 121), (b) positioning of wafer 123 bi-directionally along the same axis (perpendicular to the work surface) in order to engage the wafer with and withdraw the wafer from a spacing pad, (c) translation of wafer 123 bi-directionally along a plurality of axis that are parallel to the wafer work surface, and (d) orbital motion to the wafer within a plane parallel to the wafer work surface. Wafer holder 121 can maintain a pre-defined minimal separation distance between the wafer work surface and a spacing pad during electroplanarization. Preferably this tight control is maintained via actuators controlled by microprocessors or other similar computer controlling devices. In alternative embodiments, the wafer holder may remain motionless during electroplanarization while the components that embody the cathode are moved relative to the motionless wafer. Still in other embodiments, both the wafer (anode) and the cathode are moved relative to each other.

Wafer holder 121 may also provide back side protection to the wafer so that contaminating metal ions cannot reach the back side of the wafer during electrochemical processing. Also, wafer holder 121 makes electrical contact (via a plurality of electrical contacts) with wafer 123 at the outermost edge of metal layer 125, on the wafer's edge bevel. This positioning of the electrical contacts allows uniform electroplanarization of metal layer 125 across the entire work surface of the wafer. Electronic current is supplied via a current source 128 electrically connected to the wafer 123 and a reclaim cathode 136. In addition, a relative small current is provided between wafer 123 and flexible cathode 131 by a high impedance electrical circuit 127.

During electroplanarization, the wafer's metal layer 125, is held against a spacing pad 129. Spacing pad 129 is preferably thin, but preferably has a thickness of at least three times the largest expected variation (see 117 of FIG. 3) in the height of the metal surface to be planarized. In one preferred embodiment, the spacing pad is between about 3 and 20 $\mu$m thick. The pad should be sufficiently porous to allow electrical current and electrolyte to flow through the pad easily, having a void volume of between about 20 and 80 percent. Preferably the pores in the pad have a mean diameter of between about 0.02 $\mu$m and 10 $\mu$m. As specific examples, the pad is made of at least one of a perfluoroalkoxy material, urethane material and polyvinyl alcohol (PVA). One skilled in the art will understand that the porous structure of the pad may take many forms. For example, the pores may be generally spherical in shape as in a pad where the pores are formed as a result of gas bubbles trapped in (or forced into) a polymerized material used to make the pad. There are other embodiments of the pad structure not described herein that are within the scope of the invention.

Spacing pad 129 is affixed to a flexible planar cathode 131. In this invention, the term "flexible planar cathode" is meant to mean a cathode (made of a flexible material) having a substantially planar surface, upon which is affixed or located (if integral to the electrode material itself) the spacing pad of the invention. In such cases, the cathode is considered planar in that the surface of the cathode is planar over the global dimensions of the wafer. Electrical contact is made to the flexible cathode via components of an electrolytic cell inner cell, 133, to which the flexible cathode is attached. Preferably the flexible planar cathode is made of a flexible electrode coated with a conductive material. Preferably the flexible electrode is between about 15 $\mu$m and 300 $\mu$m thick. Also preferably, the flexible electrode is made of at least one of silicon, polyimide, Kapton (available from E. I. du Pont de Nemours Co., located in Wilmington, Del.), polyurethane, polyethylene (Mylar), mica, and polycarbonate. Or the substrate can be omitted leaving just a thin metal electrode. Alternatively the flexible electrode could be a strong metal such as stainless steel, molybdenum, tungsten, tantalum, or a nickel-based alloy such as Hastelloy® C-22, Monel® or Inconel® which has been coated (e.g. by electroplating or sputtering or chemical vapor deposition) with an electrochemically suitable metal., and the like. Preferably the conductive material which coats the flexible electrode includes at least one of platinum, copper, gold, palladium, ruthenium, various platinum-rhodium or platinum-iridium alloys, and the like. In general metal should be higher on the electrochemical series than copper (or should be copper). For example, a silicon wafer can be milled to a thickness of about 100 $\mu$m, then coated (e.g. via PVD) with platinum. A polymer material (for the pad) is spun on, and then photopatterned for holes. The polymer layer is then exposed to the appropriate treatment to form holes that serve as pores, thus forming the spacing pad. In another example, the conductive material is plated onto a polyimide sheet. First the sheet is laser drilled to provide fluid flow holes. Then the sheet is coated with a seed layer of metal, followed by electroplating with for example platinum. The spacing pad is then attached to the flexible electrode with an adhesive, for example. In yet another example, a polyurethane foam is coated onto a flexible cathode, forming the spacing pad porous structure as it sets and cures. One skilled in the art will understand that the flexible electrode/spacing pad combination of the invention is not restricted to the aforementioned exemplary embodiments. For example, although preferred spacing pads of the invention have porous structures, the flexible cathodes may or may not have porous structures.

In this example, flexible planar cathode 131 has a circular work surface. Flexible cathode 131 is attached, via its outer perimeter, to the topmost surface of inner cell 133. Inner cell 133 houses electrolyte 137. In a preferred embodiment, during electropolishing, electrolyte 137 flows upward (as indicated by the arrows in cell 133) and through a porous flexible cathode 131 and through spacing pad 129. In this case, restricted flow of the electrolyte through the cathode/pad combination creates a differential between the fluid pressure on the back side of the flexible cathode (i.e. inside cell 133) and the fluid pressure on the front side of the cathode (where the pad is located). This is one mechanism of the invention for applying a substantially uniform force per unit area to the back side of the flexible planar cathode. Preferably the substantially uniform force per unit area applied to the back side of the flexible planar cathode is between about 0.2 and 2 psi, more preferably less than 1 psi.

The aforementioned electrolyte flow pattern is also one preferred mechanism for delivering electrolyte to the spacing pad. Thus electrolyte flows through the flexible electrode and spacing pad 129. Electrical circuit 126 is closed, allowing electropolishing. The ionic component of current flows from metal layer 125, through the electrolyte contained in spacing pad 129, and to reclaim cathode 136. To a lesser degree, ionic current flows between metal layer 125 and flexible cathode 131. The high impedance of circuit 127 prevents large currents from flowing between layer 125 and cathode 131. This limits the magnitude of the Faradaic reaction on flexible cathode 131, and thereby limits the quantity of metal deposited thereon. As a result, a tight dimensional control of the separation distance between metal layer 125 and cathode 131 can be maintained, even after extended electropolishing. Further, flexible cathode 131 may be held at a positive potential with respect to reclaim cathode 136. As such, the small amount of metal that might be plated on cathode 131 can be anodically removed and deposited on reclaim cathode 136. In a sense, the flexible cathode may "float" with respect to our fixed potential elements of the electrochemical cell.

A primary role of reclaim cathode 136 is that of counter electrode to the wafer 123. Hence most of the cathodic Faradaic reaction associated with electroplanarization takes place on reclaim cathode 136. This allows flexible cathode 131 to do its job of maintaining an equipotential negative surface in close proximity to the metal layer surface—without degradation due to metal buildup. Preferably reclaim 136 is maintained at a "safe" distance from flexible cathode 131 so as to not contact it even after extended electroplanarization. In a specific example, the separation distance is about 2 to 3 centimeters. Periodically, the reclaim cathode 136 is removed from electrolyte 137 and replaced with a fresh reclaim cathode that is substantially free of plated metal from the electroplanarization process. Preferably, the reclaim electrode 136 resists attack by the electrolyte and provides a relatively conductive surface for plating metal from solution. In one preferred embodiment, the reclaim electrode is made from copper and with similar area to the wafer. Preferably, the reclaim electrode is mechanically attached to the cell in a manner that allows simple replacement.

Figure 8:
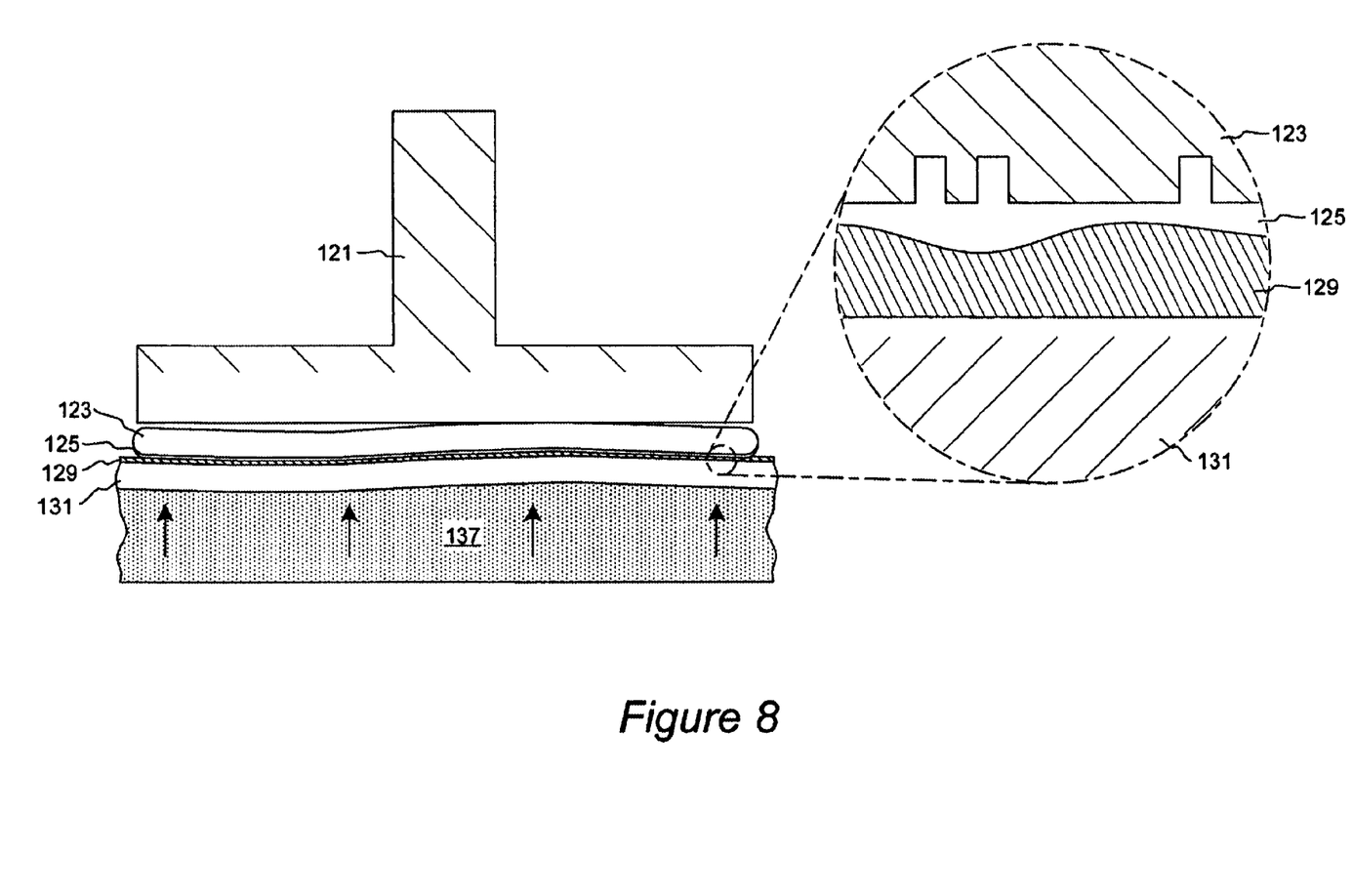
FIG. 8 is a cross-sectional depiction showing aspects of the operation of a flexible planar cathode and spacing pad of the invention.

FIG. 8 depicts how the invention provides improved plananarization (e.g., within 0.1 µm tolerances) of metal layers on wafers having very small device features. FIG. 8 shows wafer holder 121 to which is held, wafer 123. The dimensions depicted in FIG. 8 are somewhat exaggerated, but are meant only for illustrative purposes. Although silicon wafers are thin (typically ~0.5–1.2 mm thick), they are somewhat rigid. Even when held in place by, for example, a vacuum chuck, a wafer does not conform fully to the planar surface of a wafer holder or pedestal on which they reside. This is illustrated in FIG. 8 by showing that wafer 123 is rather warped, relative to the surface of wafer holder 121 on which it is held. Since wafers constrained to a wafer holder are never really flat, then conventional planarization methods, which use planar rigid structures to effect planarization on the global contour of the wafer fail. Also methods which use very thick polishing pads also fail, because the dimensions of the pad do not allow the pad to conform to the localized topography created by wafers having a plurality of raised and recessed region in the metal layer to be planarized. The invention solves this problem by having a thin spacing pad 129 in combination with a flexible planar cathode 131. As depicted in FIG. 8, due to the substantially uniform force per unit area applied (in this example by electrolyte 137), flexible electrode 131 conforms to the global contour of wafer 123. For the apparatus described in relation to FIG. 7, preferably the pad and electrode are larger in surface area than the wafer to be planarized. In this way, the wafer is free to move about the pad surface and the electrode can freely conform to the overall shape of the wafer work surface.

Referring to the inset in FIG. 8, thin (preferably on the scale described above) spacing pad 129 conforms to the local topography of metal layer 125 (created by the plurality of raised and recessed regions resulting from the electroplating processes as described above). Thus, for instance when the wafer is rotated and translated laterally during electroplanarization, flexible cathode 131 continually conforms to the global contour of wafer 123, while spacing pad 129 continually conforms to the local topography of the metal layer. As the metal layer becomes planarized, there are no local areas on the wafer that become overpolished due to non-conformity of the polishing element with the wafer contour, as in conventional electropolishing or CMP.

Referring again to FIG. 7, inner cell 133 is surrounded by an outer cell 135. Electrolyte that exits spacing pad 129 falls over the outer edge of inner cell 133 and into outer cell 135. From there, the electrolyte is circulated to an electrolyte reservoir 139. From reservoir 139, the electrolyte is recirculated into inner cell 133, for example via pump 141, where it impinges on the back side of flexible cathode 131 as described above. The electrolyte temperature and/or chemistry may be monitored and/or adjusted in reservoir 139. Appropriate monitoring and dosing apparatus are well-known in the art. In one embodiment, a bleed and feed system is employed.

Figure 9:
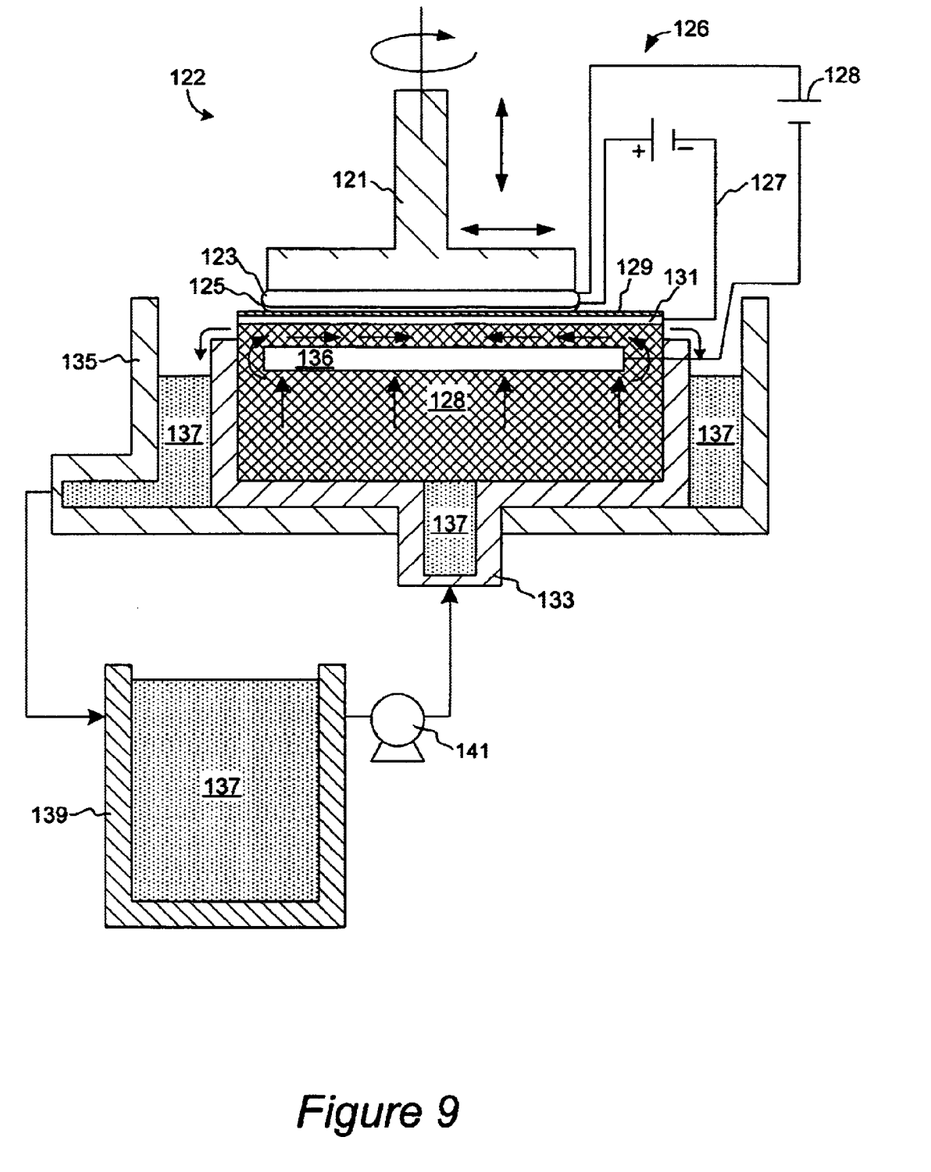
FIG. 9 is a cross-sectional depiction of an exemplary electroplanarization apparatus in accordance with the invention.

As mentioned, one way to provide a substantially uniform force per unit area to the back side of the flexible cathode is by establishing a fluid pressure differential in the electrolyte that flows through the cathode. Another way to achieve this end is by using a compressible material that contacts the back side of the flexible electrode. FIG. 9 depicts a simplified cross-sectional view of another electroplanarizing apparatus 122 of the invention. Electroplanarizing apparatus 122 is similar to apparatus 120 (see FIG. 7), but in this exemplary apparatus, flexible electrode 131 is supported by a compressible material 128. Compressible material 128 is preferably a resilient material that provides a substantially uniform force per unit area to the back side of the flexible cathode when the wafer is engaged with the spacing pad of the invention at a pre-defined separation distance. In this example, wafer holder 121 positions wafer 123 in close proximity to the cathode. The separation distance is chosen so that spacing pad 129 and metal layer 125 contact each other, and so that compressible material 128 provides a force on the back side of the flexible cathode which compresses the spacing pad between the front side of the flexible cathode and the wafer work surface. In this example, compressible material 128 is a porous material (sponge-like), which is resistant to the corrosive effects of the electrolyte. Preferably the compressible material is made of at least one of a PFA sponge or a urethane sponge. In this example, the side walls of inner cell 133 provide lateral support to compressible material 128 during electroplanarization when the wafer rubs against the spacing pad with any lateral movements. In this case, a portion of material 128 protrudes above the side walls of inner cell 133. In other embodiments, material 128 is supported entirely on is side portion, for example by a side wall of a cell, such as inner cell 133, equal in height to compressible material 128.

Referring again to FIG. 9, electrolyte 137 flows through inner cell 133 as before, but in this case the electrolyte flow passes through compressible material 128. In this example, a porous matrix in flexible planar cathode 131 is not necessarily resistant to electrolyte flow, as in the previous example. However it is preferable to have a design where electrolyte can pass through the cathode as in this case. This flow pattern allows for efficient replenishment of electrolyte that is more saturated with metal ions from the electroplanarization process. Fresh electrolyte continually flushes out the spacing pad via flow from the porous matrix of the cathode. In other embodiments, the cathode does not have a porous matrix and fresh or recycled (reduced of excess metal ion concentration from previous electroplanarization) electrolyte is sprayed or otherwise delivered to the spacing pad continually during electroplanarization.

In yet another embodiment, the fluid pressure differential in the electrolyte and the compressible nature of material 128 are combined to provide application of the substantially uniform force per unit area to the back side of the flexible cathode of the invention.

In FIGS. 7–9, the spacing pads and flexible cathodes of the invention are depicted as having a larger work surface area than that of the wafer being electroplanarized. Preferably, but not necessarily, this is the case. By making the surface area of the pad and cathode (preferably having coincidental contacting surfaces) larger than the wafer, the flexible nature of the cathode is more easily exploited so that it conforms to the global contour of the wafer work surface. Also, this allows areas of the spacing pad which are not in contact with the wafer to be flushed of spent electrolyte more easily. One way to maximize these effects and also to maximize the lifetime of the spacing pad is to further increase the usable surface area of the pad. One problem with this approach is that if such a spacing pad remains motionless during an electroplanarization process, then the wafer holder must have a large range of motion in order to reach all the usable area of the pad. One way to overcome this problem is to move both the pad and the wafer simultaneously.

Figure 10:
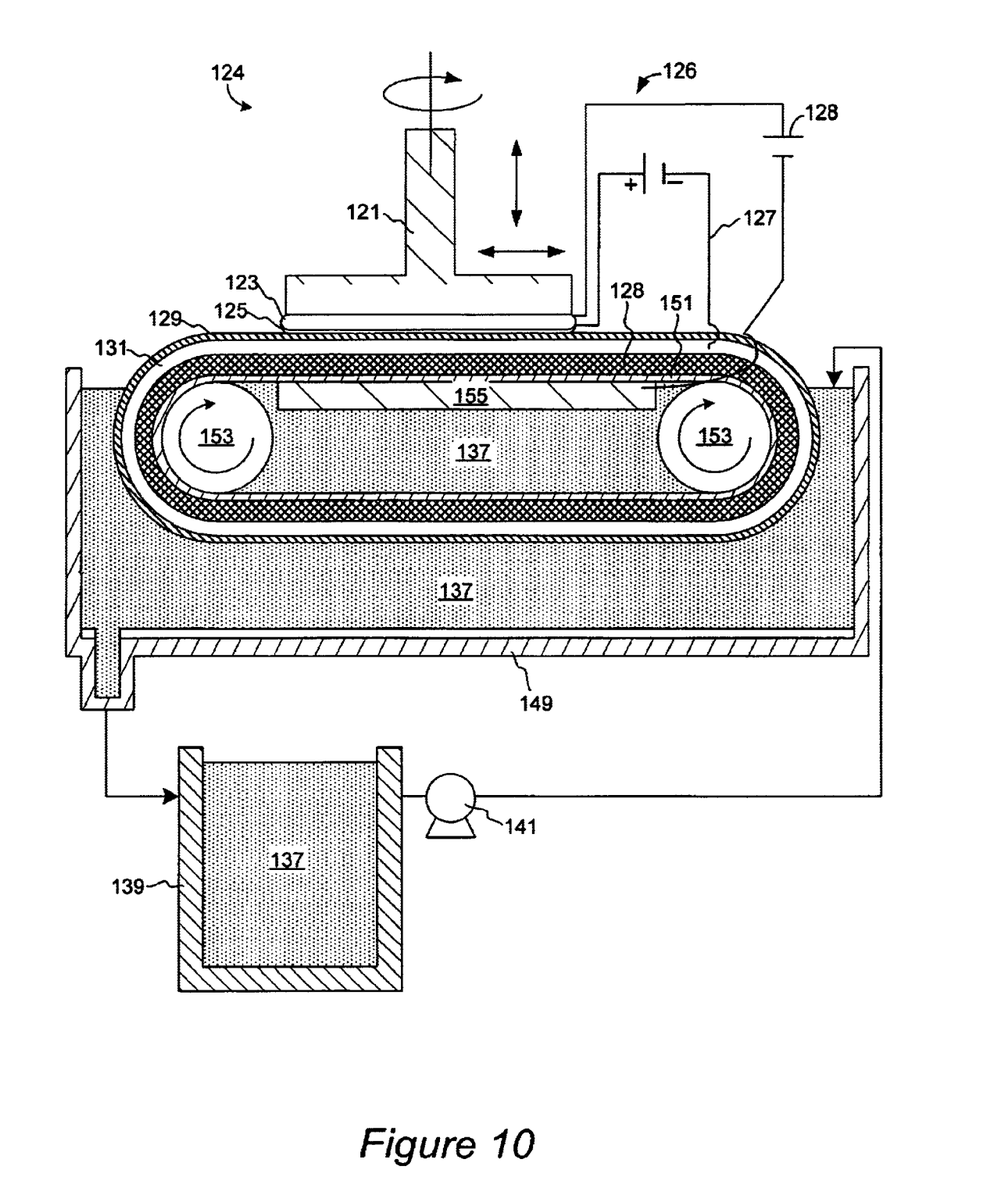
FIG. 10 is a cross-sectional depiction of an exemplary electroplanarization apparatus in accordance with the invention.

FIG. 10 depicts an electroplanarization apparatus, 124, which utilizes the concepts described above with flexible cathodes of the invention. In this example, wafer holder 121 is the same as described before in relation to FIGS. 7–9. However, in this case, spacing pad 129, flexible planar cathode 131, and compressible material 128 are laminated onto a continuous belt substrate 151. Belt substrate 151 is preferably a resilient material that is suitable for continuous rotation via rollers 153. One skilled in the art will recognize that many commercially available belt materials would work for this purpose. In this embodiment, the flexible cathode is described as planar, because like the other embodiments described, the portion of the flexible cathode that interacts with the wafer initially (via its corresponding spacing pad) is substantially planar (before conforming to the wafer global contour).

During electroplanarization, the wafer holder moves the wafer over the surface of the spacing pad as described above and the entire spacing pad/flexible cathode/compressible material/belt structure is moved under (in contact with as described in relation to FIG. 8) the wafer surface continually via rotating rollers 153. A support surface 155 (which doubles as a reclaim electrode) provides a surface against which compressible material 128 in the belt structure can compress to provide the substantially uniform force per unit area to the back side of the flexible cathode (via belt substrate 151). Electrical contact to the flexible cathode 131 can be provided via contacts (e.g. brushes) that contact the cathode at its edges on either side of the belt structure. As in the other embodiments, the apparatus is provided with a reclaim electrode onto which metal plates during electropolishing. In the depicted embodiment, the reclaim electrode is support surface 155. This need not be the case. In other embodiments, there is a separate reclaim electrode (not shown) in electrolyte 137.

As mentioned, the belt structure is continually immersed in an electrolyte bath 149. The electrolyte is circulated through reservoir 139 as in previous examples. The recycled electrolyte is returned to bath 149 and may be sprayed (not depicted) onto the spacing pad. Preferably the belt is wider than the diameter of the wafer to allow not only lateral movement of the wafer along the length of the belt surface, but also in other lateral directions, for example perpendicular to the length of the belt.

The apparatus described above were simplified depictions to exemplify the salient features of the invention. Included in apparatus of the invention are mechanisms for controlling heat buildup in the electroplanarization apparatus, reference electrodes for controlling electrochemical stability and steady state electropolishing, and end point detection mechanisms. These are described in more detail in the parent applications from which this application claims priority (as cited in the cross-reference to related applications).

Another aspect of the invention is a cathode assembly for electroplanarizing a metal layer disposed on a wafer work surface. Such a cathode assembly can be characterized by the following features (a) a flexible substrate coated with a conductive material (to form a flexible cathode), the flexible electrode having a substantially planar front side surface; and (b) a spacing pad affixed to the substantially planar front side surface of the flexible electrode. Preferably the flexible electrode and the spacing pad are made of materials and configured such that, during an electroplanarization process in which a substantially uniform force per unit area is applied to the back side of the flexible electrode, the spacing pad conforms to local surface contours in the metal layer arising from a plurality of recessed and raised regions in the metal layer, while the flexible electrode conforms only to the global contour of the wafer.

Preferably the flexible electrode is made of at least one of silicon, polyimide, Kapton, polyurethane, polyethylene (Mylar), mica, and polycarbonate. Or the substrate can be omitted leaving just a thin metal electrode. Alternatively the flexible electrode could be a strong metal such as :stainless steel, molybdenum, tungsten, tantalum, or a nickel-based alloy such as Hastelloy® C-22, Monel® or Inconel® which has been coated (e.g. by electroplating or sputtering or chemical vapor deposition) with an electrochemically suitable metal. Also preferably the flexible electrode includes a porous matrix configured to allow electrolyte to flow through it. Whether porous or not, preferably the flexible electrode is between about 15 and 300 μm thick.

Preferably the conductive material comprises at least one of platinum, copper, gold, palladium, ruthenium, and various platinum-rhodium or platinum-iridium alloys. In general metal should be higher on the electrochemical series than copper (or should be copper).

In a certain embodiments, the spacing pad comprises at least one of a perfluoroalkoxy material, urethane material and polyvinyl alcohol (PVA). Also preferably, the spacing pad has a plurality of pores and the plurality of pores in the spacing pad have a mean diameter of between about 0.02 μm and 10μm. Whatever the porous structure, preferably the spacing pad has a void volume of between about 20 and 80 percent. Preferably the spacing pad, when uncompressed, is at least about three times as thick as the largest variation in height between a plurality of recessed regions and raised regions in a metal layer disposed on a wafer work surface. In a specific embodiment, the spacing pad is between about 3 and 20 microns thick.

As mentioned the spacing pad is affixed to the substantially planar front side of the flexible electrode. In many examples, this will mean that a spacing pad is affixed via an adhesive or other binding element to the flexible electrode. It is not outside the reach of this invention to have a flexible electrode and a spacing pad that are made of the same material, and thus be a single structure. For example, manufacturing techniques can allow a conductive material to be flexible, have a porous structure, and have a surface machined or otherwise manufactured such that it will serve serve as a spacing pad as described. In all cases, a flexible planar cathode of the invention will be configured such that a substantially uniform force per unit area, when applied to the back side of the cathode, will conform the flexible electrode to the global contour of the wafer. Preferably this substantially uniform force per unit area is between about 0.2 and 2 psi, more preferably less than 1 psi.

Figure 11:
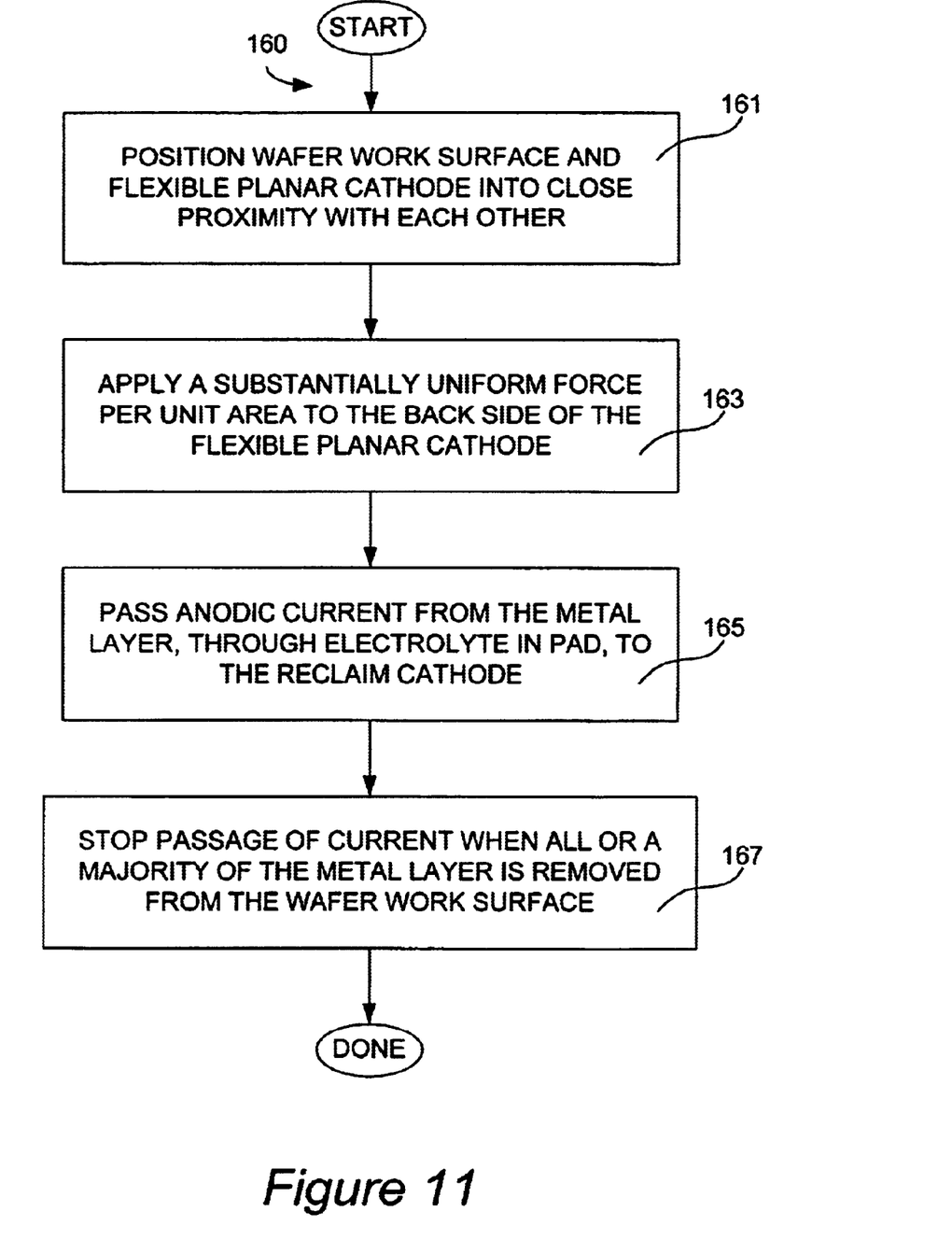
FIG. 11 is a flow chart depicting aspects of a method in accordance with the invention.

As mentioned, another aspect of the invention is a method of electroplanarizing a metal layer disposed on a wafer work surface. FIG. 11 depicts aspects of a method, 160, in accordance with the invention. First a wafer is positioned so that its work surface (which has a metal layer thereon) is in close proximity to a flexible planar cathode of the invention. See 161. Flexible planar cathodes (as described in detail above) of the invention have a spacing pad (as described in detail above) on their surface. The close proximity is a distance where the spacing pad and the metal layer contact each other. In some embodiments, a pre-defined separation distance between the wafer work surface and the flexible planar cathode is maintained during electroplanarization.

A substantially uniform force per unit area is applied to the back side of the flexible planar cathode. See 163. Preferably the substantially uniform force per unit area is between about 0.2 and 2 psi, more preferably less than 1 psi. Also, preferably the substantially uniform force per unit area to the back side of the flexible planar cathode is provided by at least one of: a fluid pressure differential in the electrolyte due to restricted flow of the electrolyte from the back side of the flexible planar cathode through a porous matrix in the flexible planar cathode and the spacing pad, and a compressive material contacting the back side of the flexible planar cathode. Preferably the spacing pad (which for example is attached to the cathode rather than part of the cathode material) is compressed between the flexible planar cathode and the metal layer.

An ionic current is passed from the metal layer, through an electrolyte solution, contained at least in the spacing pad, and to the reclaim electrode, primarily, and the flexible planar cathode, secondarily, such that metal is electrolytically removed from the metal layer. See 165. In a preferred embodiment, the anodic current is pulsed. Pulsing allows for removal of dissolved metal during off-cycles in a pulse sequence. The passage of current is ceased at a point where all or a majority of the metal layer is removed from the field of the wafer work surface. See 167. In this description, the term "field" describes the topmost surface of a layer (for example a dielectric) upon which the metal layer is deposited (see FIGS. 1–6 for example).

In preferred embodiments, relative movement between the wafer work surface and the spacing pad is created. This can be done at any stage in the described methods of the invention, preferably before current is ceased. Preferably the relative movement between the wafer work surface and the spacing pad comprises at least one of (a) rotating the wafer, the flexible planar cathode, or both about an axis substantially perpendicular to the wafer work surface, (b) moving the wafer, the flexible planar cathode, or both via linear movements along one or more axes substantially parallel to the wafer work surface, (c) orbiting the wafer, the flexible planar cathode, or both substantially parallel to the wafer work surface, and (d) combinations thereof. Most preferably, the relative movement is maintained during electroplanarization.

Preferably, using methods and apparatus of the invention, dishing across any region of the metal layer surface equal to 20 μm in diameter, is less than 100 nm deep, more preferably less than 50 nm deep.

Preferably methods of the invention include recycling the electrolyte during electroplanarization by (a) removing at least a portion of the electrolyte from a vessel in which the electroplanarization occurs, (b) adjusting the electrolyte composition by an appropriate mechanism such as (i) computer controlled bleed and feed, (ii) precise dosing to make up depleted bath components, and (iii) electrowinning, and (c) returning the electrolyte to the vessel. Preferably returning the electrolyte to the vessel comprises delivering at least a portion of the electrolyte onto a portion of the spacing pad.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of electroplanarizing a metal layer disposed on a wafer work surface, said metal layer having a plurality of recessed and raised regions, the method comprising:
   (a) positioning the wafer work surface and a flexible planar cathode into close proximity with each other, said flexible planar cathode comprising a spacing pad on its work surface, said spacing pad and the metal layer contacting each other;
   (b) applying a substantially uniform force per unit area to the back side of the flexible planar cathode, thereby compressing the spacing pad between the flexible planar cathode and the metal layer;

(c) passing an ionic electrical current from the metal layer, through an electrolyte solution contained at least in the spacing pad, and to a reclaim cathode, such that the metal is electrolytically removed from the surface of the metal layer; and (d) stopping the passage of current at a point where all or a majority of the metal layer is removed from the field of the wafer work surface.

2. The method of claim 1, further comprising substantially maintaining a predefined separation distance between the flexible planar cathode and the wafer work surface during electroplanarization.

3. The method of claim 1, further comprising creating a relative movement between the wafer work surface and the spacing pad prior to (d).

4. The method of claim 3, wherein the relative movement between the wafer work surface and the spacing pad comprises at least one of: rotating the wafer, the flexible planar cathode, or both about an axis substantially perpendicular to the wafer work surface, moving the wafer, the flexible planar cathode, or both via linear movements along one or more axes substantially parallel to the wafer work surface, orbiting the wafer, the flexible planar cathode, or both substantially parallel to the wafer work surface, and combinations thereof.

5. The method of claim 4, wherein the spacing pad comprises a porous material.

6. The method of claim 1, wherein the spacing pad is non-abrasive.

7. The method of claim 1, wherein the spacing pad comprises a plurality of pores.

8. The method of claim 7, wherein the plurality of pores have a mean diameter of between about 0.02 µm and 10 µm.

9. The method of claim 1, wherein the electrolyte contains coppers ions.

10. The method of claim 7, wherein the spacing pad has a void volume of between about 20 and 80 percent.

11. The method of claim 1, wherein the spacing pad, when uncompressed, is at least about three times as thick as the largest variation in height between the plurality of recessed and raised regions in the metal layer.

12. The method of claim 1, wherein the spacing pad is between about 3 and 20 microns thick.

13. The method of claim 1, wherein the flexible planar cathode comprises a flexible substrate coated with a conductive material.

14. The method of claim 13, wherein the flexible substrate comprises at least one of silicon, polyimide, Kapton, polyurethane, polyethylene, mica, polycarbonate, stainless steel, molybdenum, tungsten, tantalum, or a coated nickel-based alloy.

15. The method of claim 13, wherein the conductive material comprises at least one of platinum, copper, gold, palladium, ruthenium, platinum-rhodium alloys, platinum-iridium alloys.

16. The method of claim 1, wherein the reclaim electrode comprises a conductive substrate on which metal plates during electroplanarization.

17. The method of claim 1, wherein dishing, across any region of the metal layer surface greater than 20 µm in diameter, is less than 100 nanometers deep.

18. The method of claim 1, wherein dishing, across any region of the metal layer surface equal to 20 µm in diameter, is less than 50 nanometers deep.

19. The method of claim 1, wherein the substantially uniform force per unit area to the back side of the flexible planar cathode is between about 0.2 and 2 psi.

20. The method of claim 1, wherein the substantially uniform force per unit area to the back side of the flexible planar cathode is less than 1 psi.

21. The method of claim 1, wherein the flexible planar cathode comprises a porous matrix configured to allow electrolyte to flow through it.

22. The method of claim 21, wherein the substantially uniform force per unit area to the back side of the flexible planar cathode is provided by at least one of: a fluid pressure differential in the electrolyte due to restricted flow of the electrolyte from the back side of the flexible planar cathode through the porous matrix and the spacing pad, and a compressive material contacting the back side of the flexible planar cathode.

23. The method of claim 1, further comprising recycling the electrolyte during electroplanarization by:

(i) removing at least a portion of the electrolyte from a vessel in which the electroplanarization occurs;

(ii) adjusting the electrolyte composition; and (iii) returning the electrolyte to the vessel.

24. The method of claim 23, wherein returning the electrolyte to the vessel comprises delivering at least a portion of the electrolyte onto a portion of the spacing pad.

25. The method of claim 1, wherein the spacing pad comprises at least one of a perfluoroalkoxy material, urethane material and polyvinyl alcohol (PVA).

26. An electroplanarizing apparatus for removing a portion of a metal layer disposed on a wafer work surface, the apparatus comprising:

(a) a wafer holder for holding the wafer such that the metal layer is exposed, said wafer holder configured to supply an anodic electrical current to the metal layer;

(b) a flexible planar cathode having a spacing pad on its surface;

(c) a movement assembly configured to position the wafer work surface and the flexible planar cathode into close proximity with each other, whereby at least a predefined separation distance between the flexible planar cathode and wafer work surface can be maintained throughout an electroplanarization process;

(d) an electrolyte delivery mechanism configured to provide an electrolyte the spacing pad while the wafer is in contact with the spacing pad; and (e) a mechanism for applying a substantially uniform force per unit area to the back side of the flexible planar cathode, thereby compressing the spacing pad between the flexible planar cathode and the wafer work surface.

27. The apparatus of claim 26, wherein the movement assembly further comprises a mechanism for creating a lateral relative movement between the wafer work surface and the spacing pad work surface.

28. The apparatus of claim 27, wherein the lateral relative movement between the wafer work surface and the spacing pad work surface comprises at least one of: rotating the wafer, the flexible planar cathode, or both about an axis substantially perpendicular to the wafer work surface, moving the wafer, the flexible planar cathode, or both via linear movements along one or more axes substantially parallel to the wafer work surface, orbiting the wafer, the flexible planar cathode, or both substantially parallel to the wafer work surface; and combinations thereof.

29. The apparatus of claim 28, wherein the spacing pad comprises a porous material.

30. The apparatus of claim 26, wherein the spacing pad is non-abrasive.

31. The apparatus of claim 26, wherein the spacing pad comprises a plurality of pores.

32. The apparatus of claim 31, wherein the plurality of pores have a mean diameter of between about 0.02 μm and 10 μm.

33. The apparatus of claim 31, wherein the spacing pad has a void volume of between about 20 and 80 percent.

34. The apparatus of claim 26, wherein the spacing pad, when uncompressed, is at least about three times as thick as the largest variation in height between a plurality of recessed regions and raised regions in the metal layer disposed on the wafer work surface.

35. The apparatus of claim 26, wherein the spacing pad is between about 3 and 20 microns thick.

36. The apparatus of claim 26, wherein the spacing pad comprises at least one of a perfluoroalkoxy material, urethane material and polyvinyl alcohol (PVA).

37. The apparatus of claim 26, wherein the flexible planar cathode comprises a flexible substrate coated with a conductive material.

38. The apparatus of claim 37, wherein the flexible substrate is between about 15 and 300 μm thick.

39. The apparatus of claim 37, wherein the flexible electrode comprises at least one of silicon, polyimide, Kapton, polyurethane, polyethylene, mica, polycarbonate, stainless steel, molybdenum, tungsten, tantalum, or a coated nickel-based alloy.

40. The apparatus of claim 37, wherein the conductive material comprises at least one of platinum, copper, gold, palladium, ruthenium, platinum-rhodium alloys, platinum-iridium alloys.

41. The apparatus of claim 26, further comprising a reclaim electrode.

42. The apparatus of claim 26, wherein the mechanism for applying a substantially uniform force per unit area to the back side of the flexible planar cathode applies a force of between about 0.2 and 2 psi.

43. The apparatus of claim 26, wherein mechanism for applying a substantially unifonn force per unit area to the back side of the flexible planar cathode applies a force of less than 1 psi.

44. The apparatus of claim 26, wherein the flexible planar cathode comprises a porous matrix configured to allow electrolyte to flow through it.

45. The apparatus of claim 44, wherein the mechanism for applying a substantially uniform force per unit area to the back side of the flexible planar cathode comprises at least one of: a fluid pressure differential in the electrolyte due to restricted flow of the electrolyte from the back side of the flexible planar cathode through the porous matrix and the spacing pad, and a compressive material contacting the back side of the flexible planar cathode.

46. The apparatus of claim 26, further comprising an electrolyte composition adjustment mechanism for controlling the electrolyte's composition.

47. The apparatus of claim 46, further comprising a mechanism for delivering at least a portion of the electrolyte that has passed through the electrolyte composition adjustment mechanism onto a portion of the spacing pad during the electroplanarization process.

48. A flexible planar cathode for electroplanarizing a metal layer disposed on a wafer work surface, said flexible planar cathode comprising:
  (a) a flexible substrate coated with a conductive material, said flexible substrate having a substantially planar front side surface; and
  (b) a spacing pad affixed to the substantially planar front side surface of the flexible substrate.

49. The flexible planar cathode of claim 48, wherein the flexible substrate and the spacing pad are made of materials and configured such that, during an electroplanarization process in which a substantially uniform force per unit area is applied to the back side of the flexible substrate, the spacing pad conforms to local surface contours in the metal layer arising from a plurality of recessed and raised regions in the metal layer, while the flexible substrate conforms only to the global contour of the wafer.

50. The flexible planar cathode of claim 49, wherein the spacing pad comprises a porous material.

51. The flexible planar cathode of claim 48, wherein the spacing pad is non-abrasive.

52. The flexible planar cathode of claim 48, wherein the spacing pad comprises a plurality of pores.

53. The flexible planar cathode of claim 52, wherein the plurality of pores in the spacing pad have a mean diameter of between about 0.02 μm and 10 μm.

54. The flexible planar cathode of claim 52, wherein the spacing pad has a void volume of between about 20 and 80 percent.

55. The flexible planar cathode of claim 49, wherein the spacing pad, when uncompressed, is at least about three times as thick as the largest variation in height between the plurality of recessed regions and raised regions in the metal layer disposed on the wafer work surface.

56. The flexible planar cathode of claim 48, wherein the spacing pad is between about 3 and 20 microns thick.

57. The flexible planar cathode of claim 48, wherein the spacing pad comprises at least one of a perfluoroalkoxy material, urethane material and polyvinyl alcohol (PVA).

58. The flexible planar cathode of claim 48, wherein the flexible substrate comprises at least one of silicon, polyimide, Kapton, polyurethane, polyethylene, mica, polycarbonate, stainless steel, molybdenum, tungsten, tantalum, or a coated nickel-based alloy.

59. The flexible planar cathode of claim 48, wherein the conductive material comprises at least one of platinum, copper, gold, palladium, ruthenium, platinum-rhodium alloys, platinum-iridium alloys.

60. The flexible planar cathode of claim 48, wherein the flexible planar cathode is electrically coupled to a high impedance electrical circuit.

61. The flexible planar cathode of claim 49, wherein the substantially uniform force per unit area, when applied to the back side of the flexible substrate, required to conform the flexible substrate to the global contour of the wafer is between about 0.2 and 2 psi.

62. The flexible planar cathode of claim 49, wherein the substantially uniform force per unit area, when applied to the back side of the flexible substrate, required to conform the flexible substrate to the global contour of the wafer is less than 1 psi.

63. The flexible planar cathode of claim 48, wherein the flexible substrate comprises a porous matrix configured to allow electrolyte to flow through it.

64. The flexible planar cathode of claim 48, wherein the flexible substrate is between about 15 and 300 μm thick.

* * * * *